(12) United States Patent
Meisel et al.

(10) Patent No.: US 7,407,737 B2
(45) Date of Patent: Aug. 5, 2008

(54) METHOD FOR THE PRODUCTION OF PHOTORESIST STRUCTURES

(75) Inventors: Daniel Meisel, Bruchsal (DE); Iouri Mikliaev, Tschelljabinsk (RU); Martin Wegener, Karlsruhe (DE)

(73) Assignee: Forschungszentrum Karlsruhe GmbH, Karlsruhe (DE)

( * ) Notice: Subject to any disclaimer, the term of this patent is extended or adjusted under 35 U.S.C. 154(b) by 310 days.

(21) Appl. No.: 10/522,162

(22) PCT Filed: Jul. 18, 2003

(86) PCT No.: PCT/EP03/07819

§ 371 (c)(1),
(2), (4) Date: Sep. 27, 2005

(87) PCT Pub. No.: WO2004/010222

PCT Pub. Date: Jan. 29, 2004

(65) Prior Publication Data

US 2006/0154178 A1  Jul. 13, 2006

(30) Foreign Application Priority Data

Jul. 22, 2002 (DE) .............................. 102 33 309

(51) Int. Cl.
*G03F 7/00* (2006.01)
(52) U.S. Cl. .................. 430/321; 430/322; 430/394
(58) Field of Classification Search ................. 430/321, 430/322, 394
See application file for complete search history.

(56) References Cited

U.S. PATENT DOCUMENTS 3,635,540 A    1/1972    Nassenstein 3,832,565 A    8/1974    Graf et al.

(Continued)

FOREIGN PATENT DOCUMENTS

EP    0 421 645 A2    4/1991

(Continued)

OTHER PUBLICATIONS

"Crystallography of optical lattices," Petsas et al., *Physical Review A*, vol. 50, No. 6, pp. 5173-5189, Dec. 1994.

(Continued)

*Primary Examiner*—Amanda C. Walke
(74) *Attorney, Agent, or Firm*—Venable, LLP; Robert Kinberg; Kyle D. Petaja

(57) ABSTRACT

The invention relates to a method for producing a large variety of photoresist structures, wherein a volume of photosensitive material (5) is exposed at least once by means of at least two light beams (1, 2), which are superposed inside the photosensitive material (5), and is subsequently subjected to a developing process, wherein the light beams (1, 2) penetrate at least one transparent optical element (3).

Figure 1:
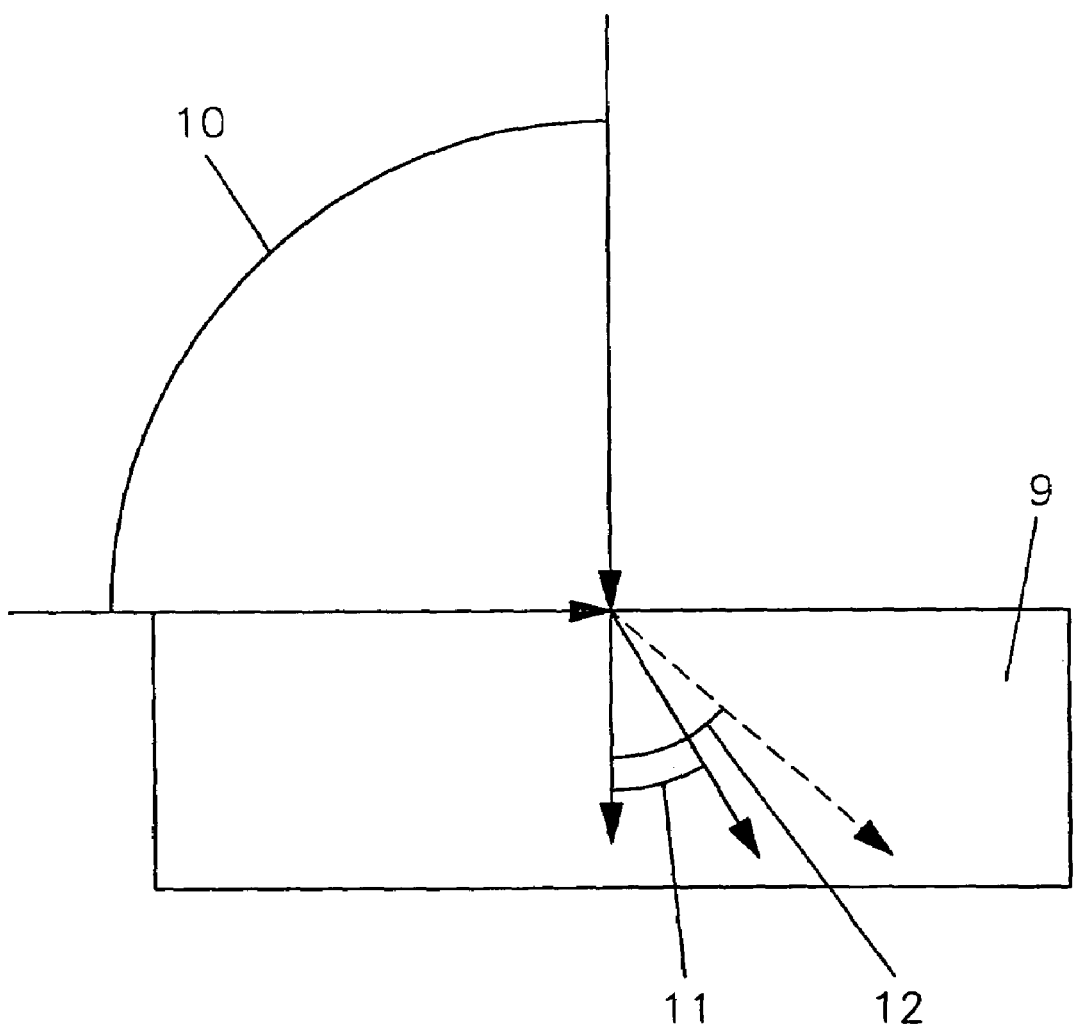

The optical element (3) is a polyhedron with planar or curved surfaces which largely prevents refraction of the light beams on the surface of the volume of photosensitive material (5) when the beams are fed-in and/or fed-out of the volume of photosensitive material (5), so that the angle of refraction for the light beams (1, 2) can be greater in the volume of photosensitive material (5) than the critical angle of the total reflection, which has a limiting effect without optical element (3).

15 Claims, 2 Drawing Sheets

U.S. PATENT DOCUMENTS

| | | | | | |
|---|---|---|---|---|---|
| 5,017,263 | A | * | 5/1991 | Clark | 438/27 |
| 5,461,455 | A | * | 10/1995 | Coteus et al. | 355/43 |
| 2002/0135833 | A1 | | 9/2002 | Clube | |

FOREIGN PATENT DOCUMENTS

| EP | 0 795 803 A2 | 9/1997 |
|---|---|---|
| GB | 1 289 095 | 9/1972 |
| WO | WO 01/13181 A1 | 2/2001 |
| WO | WO 01/22133 A1 | 3/2001 |

OTHER PUBLICATIONS

"Photonic band gap formation in certain self-organizing systems," Busch et al., *Physical Review E*, vol. 58, No. 3, pp. 3896-3908, Sep. 1998.

"Three-dimensional face-centered-cubic photonic crystal templates by laser holography: fabrication, optical characterization, and band-structure calculations," Miklyaev et al., *Applied Physics Letters*, vol. 82, No. 8, pp. 1284-1286, Feb. 24, 2003.

"Holographic photonic crystals," Escuti et al., *Optical Engineering*, vol. 43, No. 9, pp. 1973-1987, Sep. 2004.

"Three-dimensional photonic crystals by holographic lithography using the umbrella configuration: Symmetries and complete photonic band gaps," Meisel et al., *Physical Review B*, 70, pp. 165104-1-165104-10, 2004.

Chaitanya K. Ullal et al., "Photonic Crystals Through Holographic Lithography: Simple Cubic, Diamond-Like, and Gyroid-Like Structures," Applied Physics Letters, Jun. 28, 2004, pp. 5434-5436, vol. 84, No. 26.

* cited by examiner

METHOD FOR THE PRODUCTION OF PHOTORESIST STRUCTURES

The invention relates to a method for producing structures in a volume of photosensitive material (photoresist volume).

To produce photoresist structures, a photosensitive material is exposed by means of a multiple-beam interference pattern, resulting from the superposition of several light beams, and is subsequently developed as described for the so-called holographic lithography disclosed in reference WO 01/22133 A1. The shape of the photoresist structures developed in this way generally depends on the angles of the interfering light beams inside the photoresist. For the feeding-in or feeding-out of the light beams, this reference suggests using a transparent optical element and, if necessary, an immersion substance disposed between solid optical elements.

It is the object of the present invention to produce a larger variety of photoresist structures.

This object is solved with the features disclosed in patent claim 1. Advantageous embodiments of the invention are described in the dependent claims.

When light beams coming from an external medium (e.g. air) with a lower refractive index than a photoresist are fed into a volume of photosensitive material, the range of the propagation directions that can be realized for the light beams inside the volume of photosensitive material is limited to an undesirable degree. The reason for this is that the refraction of the beams must be taken into consideration for the transition from the external, optically less dense medium to the photoresist, which can be compensated only to a limited degree by selecting the direction of incidence for the beam, as suggested according to the WO 01/22133 A1.

The maximum achievable angle of refraction for feeding in a beam from the external medium is the critical angle for the total reflection, which assumes an approximate value of 36° for air and typical photosensitive materials. This value would require a glancing incidence. For that reason, angles higher than the critical angle for the total reflection cannot be adjusted inside the photoresist by selecting the feed-in direction.

A volume of photosensitive material is initially exposed by means of two, three, four, five, six or more light beams, which are superposed inside the photoresist in such a way that an interference pattern is created in this material. The volume of photosensitive material is then subjected to a developing process, which results in the creation of a photoresist structure that matches the interference pattern.

According to the invention, two, three, four, five, six or more partially coherent light beams are fed via a polyhedron into the photosensitive material or out of the photosensitive material. Beam angles are thus made possible inside the photoresist which are beyond the critical angle for the total reflection, meaning angles between the beams on the inside of the photoresist, which cannot be achieved through a direct beam feed-in from the external medium. If the external medium is air, this involves the considerable value range of approximately 36° to 90°.

The feeding-in and feeding out of the light beams is additionally improved considerably by using a polyhedron, even for angles of refraction below and in particular near the critical angle for the total reflection.

According to the invention, the optical elements are designed as polyhedrons, preferably in the form of partial prisms, wherein a pyramid shape and especially a truncated pyramid shape are particularly preferred, or in a different embodiment as segment of a sphere.

The volume of photosensitive material can be deposited directly onto the optical element to make possible the transition of the beams from the optical element into the volume of photosensitive material. According to a different embodiment, an immersion substance is disposed between the optical element and the volume of photosensitive material, wherein this immersion substance can be omitted if the photoresist is exposed while in a liquid state.

One particular advantage of the method according to the invention is that all Bravais lattices can be produced and not just a few select Bravais lattices. This is particularly true for the face centered cubic (fcc) structure (see K. Busch, S. John, PRE 1998, 58, p. 3896), which is of interest regarding a three-dimensional, complete energy gap.

The difference between the refractive index of air and photoresist (1 and/or 1.6 for the photoresist SU-8) presumably is not sufficient to achieve a complete, three-dimensional energy gap in the photonic crystal. The complementary structure of high-refractive material can be produced by filling in (infiltrating) the pores of the photoresist structure (template, lost form) with a transparent and high-refractive material and by subsequently removing the photoresist. For this, the pores as well as the photoresist lattice must respectively be interconnected. The pores must be interconnected so that on the one hand the non-polymerized photoresist can be removed and, on the other hand, the interconnected pores can subsequently be filled with high-refraction material (infiltrated). The photoresist structure must be interconnected so that it is mechanically stable and does not fall apart.

We want to point out in this connection that according to reference WO 01/22133 A1, an attempt was made to produce fcc structures with the aforementioned multiple-beam interference method by allowing light beams to be fed in directly from the air. However, owing to the refraction on the critical surface between air and photoresist, no fcc structure was actually created inside the photoresist, but rather a different type of structure. Based on the present level of knowledge, this structure is not suitable for use as template for photonic crystals having a complete three-dimensional energy gap.

Photoresist structures according to the invention furthermore are suitable for use as effective surface coatings, as particle filters, as micro-mixers, as volume grids, as diffraction structure or dispersive structure, as photonic crystal, or as lost form for a photonic crystal.

Figure 2:
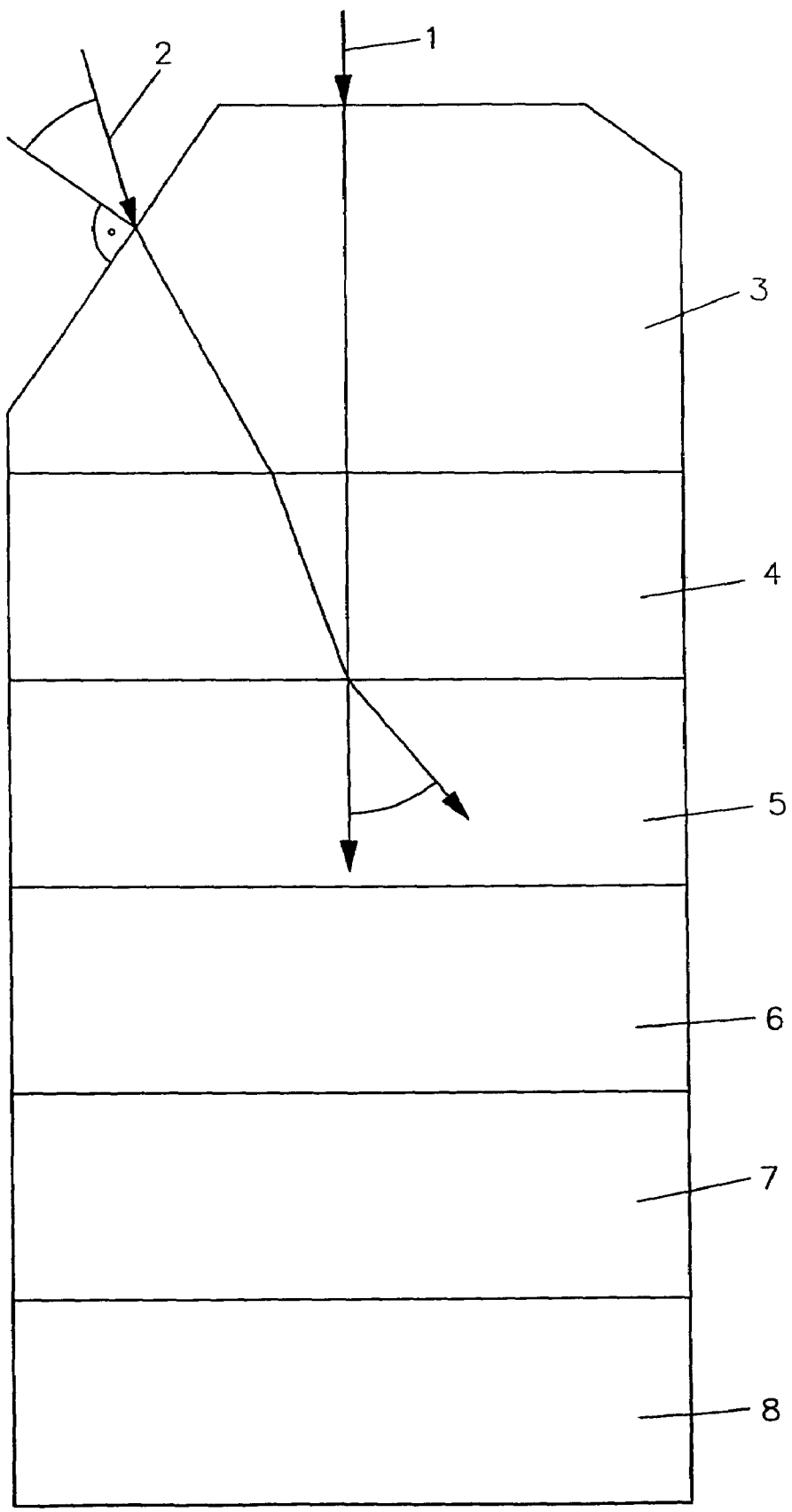

The invention is described in the following with the aid of the Figures, showing in:

FIG. 1 Beam angles realized inside a photosensitive material, which exceed the critical angle of the total reflection and FIG. 2 A schematically shown layer structure for this method.

As a result of the refraction on the limit surface between air and photoresist, a light beam with an angle of incidence of α 10 to the surface normal (vertical line) for the photoresist 9 is refracted according to Snell's law of refraction into the photoresist 9

$$\sin(\alpha) = n_{photoresist} \times \sin(\gamma)$$

wherein γ 11 refers to the angle of the refracted light beam, relative to the surface normal inside the photoresist. For the photoresist used, the exposure value is n≈1.67.

With a four-beam configuration in a so-called umbrella-type arrangement (umbrella-like configuration) (see K. I. Petsas et al., Phys. Rev. A 1994, 50, page 5173), three of the beams—henceforth called secondary beams—and/or their wave vectors are positioned uniformly distributed on a cone envelope, as shown in FIG. 1, wherein all three wave vectors point toward the cone tip. The additional beam—henceforth called reference beam—is positioned on the cone axis and also points toward the cone tip. The reference beam forms the normal to the reflecting surface for the photoresist layer. To produce a structure with fcc translation symmetry with this beam configuration, for example, the angle between the secondary beams and the reference beam inside the photoresist must be $\gamma_{fcc}=\arccosine(7/9) \approx 38.94°$.

The total reflection initially counteracts the realization of this configuration because the critical angle for the total reflection $\gamma_{critical}$ 11 for the photoresist SU-8 is $\gamma_{critical}=\arcsine(1/n_{photoresist}) \approx 36.78° < \gamma_{fcc}$. This fact prevents the realization of the internal angle $\gamma_{fcc}$ 12 and actually all angles $\gamma > \gamma_{critical}$ between the reference beam and the secondary beams inside the photoresist if the beam is fed in directly from the air. That is the reason why structures with fcc translation symmetry and, for example, also with simple cubic (sc) translation symmetry ($\gamma_{sc}=\arc cosine((\sqrt{3}/6) \approx 73.22°$), cannot be produced in this configuration through exposure by means of light that is fed in directly from the air.

Commercially available negative photosensitive materials were used for the exemplary embodiment, e.g. the photoresist SU-8. These materials were deposited with the aid of a centrifuge for photosensitive material (spincoating) onto glass substrates (diameter 25 mm, thickness 5-7 mm), thereby creating layer thicknesses of approximately 10 to 50 µm. The sample was then heated for approximately 1 hour to 65° C. (soft bake) to remove most of the solvent.

An umbrella-type arrangement (umbrella-like configuration) is used for the subsequent exposure in the multiple-beam interference arrangement. The four mutually coherent beams were obtained by dividing a laser beam with the aid of beam dividers. For example, a Q-switched, frequency-tripled (355 nm wavelength) Nd-YAG pulsed laser, seeded so as to be single-mode in longitudinal direction, is suitable for this. A pulse length of approximately 6 ns made it possible to avoid the loss of definition due to shaking. It is advantageous if the intensity and polarization can be adjusted separately for each partial beam, which means in particular that the beams can be adjusted independent of each other, either having elliptical, circular, or linear polarization. According to a special design, the reference beam has a circular polarization and the three secondary beams have linear polarization, meaning they are polarized in their respective plane of incidence (so-called p-polarization). The ratio for the beam energies was 1.5:1:1:1 for reference beam:secondary beam No. 1:secondary beam No. 2:secondary beam No. 3.

The photoresist was exposed by means of these beams with a single laser pulse. The pulse energy required for this exposure was approximately 8 mJ before the beam was divided into four partial beams. For a beam cross-sectional surface of approximately ½ cm$^2$, the energy for each surface, averaged via the cross section of the laser beam, amounted to approximately 16 mJ/cm$^2$. This led to a filling factor for the structures of approximately 50%.

To generate a structure with fcc translation symmetry in the photoresist, half the opening angle $\gamma$ for the cone inside the photoresist must meet the requirement $\gamma=\arccosine(7/9) \approx 38.94°$. This angle is achieved according to the invention through the upstream installation of a specially designed polyhedron. A modified retroreflector with severed-off tip and polished cutting surface is used for this (truncated pyramid). The beam guidance is shown in FIG. 2.

The light beams 1, 2 are guided by the optical element 3, designed as feed-in prism, via an immersion substance 4 of distilled water into the volume of photosensitive material 5, which for this embodiment has been deposited on a glass substrate 6. To suppress retroreflections from the underside of the substrate 6, a black-anodized aluminum sheet functions as absorber 8 to end the beam path. An additional immersion substance 7 of oil is disposed between substrate 6 and absorber 8. Without this measure for feeding out the beam, the reference beam 1 would be partially reflected on the underside of the substrate and the other three beams 2 would be totally reflected and would be superimposed on the interference, so as to interfere.

The photoresist material exposed by means of the interference pattern was heated for approximately 6 minutes for the polymerization, causing the temperature to rise from approximately 65° C. to approximately 92° C. (post exposure bake). The sample was allowed to rest for at least 30 minutes, following removal from the oven and cooling down.

For the development, the samples were left to rest for approximately 30 minutes to approximately 1 hour in a bath with SU-8 developer, containing 1-methoxy-2-propyl acetate. The weakly exposed regions of the photoresist were dissolved in the developer during the developing process, while the regions with stronger exposure remained (SU-8 is a so-called "negative" photoresist). The developing process was completed after an approximately 10 minute bath in 2-propanol.

The samples show fissures resulting from the non-uniform change in volume (swelling and/or shrinking) during the developing process. The sample occasionally will separate totally or partially from the substrate, in which case templates free of substrate are available as well. The resulting fragments have a surface area of approximately 1 mm$^2$ and the form and size of these fragments can be controlled by purposely scratching the photoresist (in the form of predetermined breaking points).

The respectively inverted structure is obtained when using a positive photoresist in place of a negative photoresist.

A purposeful, non-destructive separation of the template from the substrate can be achieved by dipping it into a bath with heated or boiling hydrochloric acid.

The photoresist of a different advantageous embodiment of the invention is exposed through the glass substrate, for which the substrate 6, including the photosensitive material 5 deposited thereon with the spin-coating technique, is turned over. The beams are fed in from the extremely planar side of the photoresist, which fits flush against the substrate 6, instead of from the generally less perfect surface of the photoresist layer that is facing away.

When entering from the external medium (e.g. air) into the prism, all partial beams experience more or less strong reflection losses which can be avoided by providing all incident surfaces with antireflection coatings suitable for the angle of incidence and the respective polarization.

For a given internal angle in the photoresist and the deviating angle in the prism (because of the generally different refractive index), the slanted incident surfaces of a particularly advantageous embodiment are produced with an orientation that results in the desired angle inside the photoresist, in particular if a beam is fed perpendicular into the side surfaces of the prism. The correct feed-in direction can be controlled particularly easily and precisely since the residual retroreflection (also present with an antireflection coating) can be used as indicator, making it particularly easy to verify the reflection of a beam into itself (retroreflection). In addition, an antireflection coating that is independent of the beam polarization is obtained.

According to a different advantageous embodiment, the immersion substance and the material for the prism are selected such that they have the same refractive index as the photoresist, thereby avoiding even insignificant retroreflections and increasing the feed-in efficiency.

According to yet another embodiment, the incident surfaces on the side are oriented such that with a correct adjustment of the incident beams, these surfaces are located exactly below the Brewster angle. As a result, the correct adjustment of the angle can be detected precisely by the disappearance of the reflection of the p-component of the beam.

According to a different embodiment, all four beams are adjusted parallel to each other, but are offset on the side, relative to each other. The incident surfaces of the prism are oriented such that the refraction upon entering the prism will generate the required angles. The required parallel arrangement of the beams can be realized with high precision, for example by using beam dividers of plane-parallel plates with a suitable thickness. The problem of adjusting a precise angle between the four beams is thus almost completely solved by making use of the well-known method of creating computed angles during the prism production.

For a different advantageous embodiment, a different prism is provided in place of an absorber 8 for feeding out the light beams which have already passed through the photoresist and the substrate, wherein this prism is identical to the prism used for the feed-in. The fed out beams are then available for further analyses, for example for checking the polarization states of the beams.

A different advantageous embodiment of the beam configuration consists in the laser beam being divided into four partial beams, wherein the wave vectors of two beams are located in one plane and the wave vectors of the other two beams are located in a different plane which is perpendicular to the first plane. The wave pair with wave vectors located in the first plane here propagates in counter direction as the wave pair in the other plane (K. I. Petsas et al. PRA 1994, 50, page 5173). Each pair of partial beams has the same angle bisector between the two partial beams, which simultaneously forms the normal for the photoresist layer.

The following example of four directional vectors for the wave propagation results in the above configuration of a fcc structure:

[2,0,1], [−2, 0, 1], [0, 2, −1], [0, −2, −1].

The photoresist layer is exposed from two sides, meaning from two half spaces which are separated by the photoresist layer. The internal angle of the beams to the normal for the photoresist layer in that case is respectively $\gamma_{fcc}=0.5*\arccos(-3/5)\approx 63.43°$. This angle inside the photoresist layer cannot be achieved if the beam is fed in directly from the air.

It follows from this that the beams coming from one half space must be fed into the photoresist material and the beams coming from the other half space must be fed out, which is achieved by positioning the photoresist layer between two roof prisms, wherein the roof surfaces point toward the outside and the prisms are rotated by 90° relative to each other. Each of these roof prisms functions as feed-in element for one beam pair and as feed-out element for the other beam pair. This is achieved through chamfering (modifying) the perpendicular side surfaces of the prisms to form pyramids. Through each of these modified roof prisms, the one beam pair is fed in and other beam pair is fed out. To feed in the light and feed it out again, a separate layer of a suitable immersion substance 4, 7 must be disposed between the modified roof prism and the photoresist layer and/or the substrate.

According to a different embodiment, some areas of the photoresist are purposely covered during the exposure (masking), so that only parts of the interference pattern are preserved in the photoresist, for example making it possible to obtain templates with a selectable edge shape. This procedure is of interest for positive as well as negative photoresists because the non-exposed areas—meaning the areas covered by the masking—either remain in place or are dissolved.

By using a structured pre-exposure or post-exposure of the photoresist, for example by means of a conventional masking technique, the photoresist of a different advantageous embodiment can be over-exposed in specific areas. Following this, the above-described multiple-beam interference technique is also used on the areas which have not yet been exposed. With a negative photoresist, the over-exposed areas form a solid material.

A photoresist template surrounded by solid material is created in this way, which permits a better handling of the resulting photoresist template, particularly if the complete photoresist layer is separated from the substrate. Complementary structures can be realized in each case by changing to a positive photoresist.

According to yet another embodiment, a layer of negative photoresist, e.g. consisting of SU-8, which was completely over-exposed with a UV lamp and then selectively developed (adhesive layer rendered passive), can be overlaid with an additional photoresist layer, e.g. also consisting of SU-8, which is then exposed by means of an interference pattern. Upon development of this layer, which is deposited on the adhesive layer, a template is obtained which rests on a solid layer of photoresist (adhesive layer) following the separation from the substrate. This adhesive layer then forms a very thin substrate having the same chemical composition as the photoresist structure.

The absorption of light during the propagation through the photoresist results in a decrease of the light intensity along the direction of propagation and, according to a different embodiment, provides the option of varying the filling factor with the depth (course-structure). The absorption and thus also the intensity of the variation with the depth can be influenced through suitable admixtures to the photoresist and/or by depositing several layers of different types of photosensitive materials with different light sensitivities.

Conversely, a more homogeneous composition of the photoresist structure can be achieved by avoiding the absorption, for example through the cleaning and removal of absorbing admixtures.

Since the beams enter the photoresist at a slant, the effective beam cross section consequently differs from that of the original beam cross section, for example a round beam cross section. A better overlapping of all beams can be achieved by pre-deforming the beam cross sections with known optical elements, for example with anamorphic prism pairs, such that the cross sections effectively become circular as a result of the slanted feed-in.

Different types of structures, in particular spiral structures, result from the propagation of the reference beam in the opposite direction, as compared to the umbrella-like configuration.

One special embodiment of the method according to the invention uses only three beams, thus making it possible to create two-dimensional periodic photoresist structures. With the aid of a feed-in prism according to the invention, larger angles can be realized between the beams in the volume of photosensitive material and thus smaller lattice constants than with a direct feed-in from the air.

The invention claimed is:

1. A method for producing photoresist structures, comprising:

exposing a volume of photosensitive material at least once with at least two light beams, each having an angle of incidence greater than a critical angle, which beams are superposed inside the photosensitive material, wherein the light beams penetrate at least one transparent optical element, and wherein the optical element comprises a polyhedron including at least one of planar or curved surfaces; and subjecting the photosensitive material to a developing process.

2. The method for producing photoresist structures according to claim 1, wherein the polyhedron comprises a partial prism including the planar surfaces.

3. The method for producing photoresist structures according to claim 2, wherein the partial prism comprises a pyramid.

4. The method for producing photoresist structures according to claim 2, wherein the partial prism comprises a truncated pyramid.

5. The method for producing photoresist structures according to claim 1, wherein the polyhedron comprises a spherical segment.

6. The method for producing photoresist structures according to claim 1, further including:

prior to exposing, depositing the volume of photosensitive material directly onto the optical element.

7. The method for producing photoresist structures according to claim 1, further including:

prior to exposing, depositing the volume of photosensitive material in-between two optical elements.

8. The method for producing photoresist structures according to claim 6, further including:

prior to exposing, depositing an immersion substance between the optical element and the volume of photosensitive material.

9. The method for producing photoresist structures according to claim 1, further including:

adjusting the light beams independently of each other with respect to at least one of intensity, phase or polarization.

10. The method for producing photoresist structures according to claim 1, wherein exposing includes:

exposing the volume of photosensitive material at least twice, wherein between the exposures the light beams and the volume of photosensitive material are moved relative to each other.

11. The method for producing photoresist structures according to claim 1, further including:

covering individual regions on a surface of the volume of photosensitive material with at least one shadow mask.

12. The method for producing photoresist structures according to claim 1, wherein exposing includes:

additionally exposing the volume of photosensitive material with a single beam.

13. The method for producing photoresist structures according to claim 1, further including:

dividing the volume of photosensitive material into segments.

14. The method for producing photoresist structures according to claim 1, further including:

deposing the volume of photosensitive material on top of another volume of photosensitive material which is exposed with at least one beam.

15. A photoresist structure produced according to a method as defined in claim 1.

* * * * *